(12) United States Patent  
Sone (10) Patent No.: US 7,267,553 B2  
(45) Date of Patent: Sep. 11, 2007

(54) OPTICAL TRANSCEIVER USING OPTICAL SUB-ASSEMBLY HAVING MULTIPLE LEAD PINS CONNECTED TO THE SUBSTRATE BY A FLEXIBLE PRINTED CIRCUIT

(75) Inventor: Hidemi Sone, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/436,976

(22) Filed: May 19, 2006

(65) Prior Publication Data

US 2006/0263013 A1 Nov. 23, 2006

Related U.S. Application Data

(60) Provisional application No. 60/682,832, filed on May 20, 2005.

(51) Int. Cl.  
*G02B 6/42* (2006.01)

(52) U.S. Cl. ............................ 439/67; 439/496; 385/88

(58) Field of Classification Search .................. 439/67, 439/496, 77; 385/88–94  
See application file for complete search history.

(56) References Cited

U.S. PATENT DOCUMENTS

| | | | | |
|---|---|---|---|---|
| 4,928,206 A | * | 5/1990 | Porter et al. ................. | 361/699 |
| 6,341,066 B1 | * | 1/2002 | Murowaki et al. .......... | 361/707 |
| 6,358,064 B2 | * | 3/2002 | Szalay et al. ................. | 439/67 |
| 6,705,769 B2 | * | 3/2004 | Brezina et al. ............... | 385/88 |
| 6,817,782 B2 | * | 11/2004 | Togami et al. ................ | 385/92 |
| 7,101,205 B2 | * | 9/2006 | Hatanaka et al. ........... | 439/165 |
| 2001/0041465 A1 | * | 11/2001 | Szalay et al. ................. | 439/67 |
| 2002/0041470 A1 | * | 4/2002 | Nayak et al. ............. | 360/261.1 |
| 2004/0093609 A1 | * | 5/2004 | Choi .......................... | 720/601 |
| 2004/0233799 A1 | * | 11/2004 | Takahashi et al. ........ | 369/30.36 |
| 2005/0183101 A1 | * | 8/2005 | Li et al. ...................... | 720/601 |
| 2005/0286579 A1 | | 12/2005 | Yoshikawa | |
| 2006/0073711 A1 | * | 4/2006 | Hatanaka et al. ............. | 439/67 |
| 2006/0093287 A1 | * | 5/2006 | Yoshikawa et al. ........... | 385/92 |
| 2006/0140554 A1 | * | 6/2006 | Oki ............................. | 385/92 |
| 2006/0158775 A1 | * | 7/2006 | Sega et al. ................ | 360/97.01 |

FOREIGN PATENT DOCUMENTS

JP 11-345987 A 12/1999

\* cited by examiner

*Primary Examiner*—Gary F. Paumen  
(74) *Attorney, Agent, or Firm*—Venable LLP; Michael A. Sartori; Steven J. Schwarz (57) ABSTRACT

The present invention provides a coupling mechanism between the optical subassembly and the circuit board using the FPC board. The mechanism according to the present invention may release the mechanical stress induced in the root portion of the lead pin of the optical subassembly and shows a superior productivity. The optical assembly provides a plurality of lead pins arranged in at least two rows. The FPC board bent in the U-shape is put between rows and soldered to the lead pins in the pads thereof. One piece of the FPC board is extended to the circuit board and soldered thereto.

15 Claims, 11 Drawing Sheets

OPTICAL TRANSCEIVER USING OPTICAL SUB-ASSEMBLY HAVING MULTIPLE LEAD PINS CONNECTED TO THE SUBSTRATE BY A FLEXIBLE PRINTED CIRCUIT

CROSS REFERENCE TO RELATED APPLICATIONS

This application claims priority to and the benefit of U.S. Provisional Patent Application No. 60/682,832 filed on May 20, 2005, entitled Optical Transceiver using optical subassembly having multiple lead pins connected to the substrate by a flexible printed circuit, and relates to a prior application of Ser. No. 11/150,282, filed on Jun. 13, 2005, entitled An optical subassembly with a heat-radiating fin and an optical transceiver installing the same, which is incorporated herein by references in their entirety.

BACKGROUND OF THE INVENTION

1. Field of the Invention

The present invention relates to a coupling mechanism between an optical subassembly and a circuit board, in particular, a coupling mechanism using a flexible printed circuit board.

2. Related Prior Art

Conventional coupling mechanism between an optical subassembly (hereinafter denoted as OSA) and a circuit board with a flexible printed circuit board (hereinafter denoted as FPC board) is, for example, one end portion of the FPC board is inserted with lead pins of the OSA and the FPC board thus assembled with the OSA is connected to a primary surface of the circuit board by bending the FPC board between the OSA and the circuit board. Such mechanism has been disclosed in a Japanese Patent application published as JP-H11-345987A.

However, this conventional mechanism has various subjects to be solved. That is:

(1) The FPC board is necessary to extend to be bent, which influences the high frequency performance of the transceiver that installs the OSA and the circuit board;

(2) Although a gap between the OSA and the circuit board may be adjusted by bending the FPC board to align the OSA along an optical axis thereof, mechanical stress is induced at the contact point of the FPC board with the circuit board, which causes a break of wiring pattern on the FPC board;

(3) Electrical connection between the OSA and the circuit board is realized by inserting the lead pins of the OSA into via holes provided in the FPC board and by soldering thereafter. However, the space between lead pins becomes smaller as the transceiver miniaturizes, which makes it hard to insert lead pins into the holes and to solder them. For example, assuming the diameter of the OSA is 3.8 mm and has four lead pins, the space therebetween becomes 0.45 mm. Moreover, for the side of the circuit board, the space between via holes into which the lead pin is inserted therein is only left by 0.5 mm, assuming the diameter of holes is 0.45 mm. The FPC board applicable to such small spaced lead pins is hard not only to manufacture it but also to solder them.

(4) A functional OSA requires a number of lead pins. One type of such numerous lead pins is known as an arrayed lead pin, in which the pitch of lead pins becomes further smaller as compared to those mentioned above. In order to solder or to connect this arrayed lead pins to the FPC board, respective pins is necessary to be expanded in their interval at a distal end, which makes it complex and costly to manufacture the transceiver.

SUMMARY OF THE INVENTION

One aspect of the present invention relates to a coupling mechanism with a flexible printer circuit board between an optical subassembly and a circuit board each installed within an optical transceiver. The optical subassembly provides a plurality of lead pins arranged in at least two rows. The flexible printed circuit board is folded between these two rows of the lead pins with a U-shape side cross section thereof. Thus, the lead pins in the optical subassembly are connected with a wiring pattern formed on a primary surface of the flexible printed circuit board without forming via holes the lead pins are to be inserted therethrough.

The coupling mechanism of the present invention may further include a support member put between the U-shaped flexible printed circuit boards. The support member may support not only the flexible printed circuit board but also the lead pins. Accordingly, the productivity of the coupling mechanism may enhance and the reliability thereof may be also enhanced because the support member relaxes the mechanical stress applied to the lead pins during the manufacturing.

The support member may extend in both sides thereof so as to put the optical subassembly therebetween. According to this arrangement, a positional relation between the flexible printed circuit board with the support member and the optical subassembly may be automatically determined in all directions.

Moreover, both side portions of the flexible printed circuit board may extend so as to come in contact with the side of the subassembly. According this arrangement of the flexible printed circuit board, electrical and thermal contact between the optical subassembly, especially in its package, and the circuit board because one wiring pattern on the flexible printed circuit board may come in contact with the optical subassembly, while, the other end of the wiring pattern is connected to the wide ground pattern on the circuit board. Therefore, the heat dissipating efficiency of the optical subassembly can be improved and the shielding effect against the electro-magnetic-interference can be also enhanced.

The coupling mechanism of the present invention mentioned above may be applicable to an optical transceiver that includes at least one of a transmitting optical subassembly and a receiving optical subassembly, a circuit board, and a flexible printed circuit board. The circuit board installs an electronic circuit. The optical subassembly provides a plurality of lead pins that are arranged in at least two rows. The flexible printed circuit board is folded in a U-shape including first to third pieces. The third piece connects the first piece with the second piece. The first piece is connected with one of rows of the lead pins, while, the second piece is connected to the other of rows of the lead pins. One of first and second pieces is connected to the circuit board. Thus, even when the optical subassembly provides a number of lead pins, to apply the flexible printed circuit board with the U-shape cross section may improve the connectivity of the lead pins with the circuit board.

DESCRIPTION OF PREFERRED EMBODIMENT

One feature of the present invention relates to a coupling mechanism between the OSA and the circuit board, in particular, a mechanism using the FPC board. Specifically, the FPC board is bent to a U-shape to make end portions thereof parallel to the circuit board and thus bent FPC board is sandwiched by lead pins of the OSA. Accordingly, the following features may be realized;

(i) The FPC board may be shortened between the OSA and the circuit board, which improves the high frequency performance of the transceiver. In particular, by matching the transmission impedance of the wiring pattern formed on the FPC board to the characteristic impedance, the degradation of the signal may be suppressed.

(ii) Since the contact between the lead pins and the FPC board is carried out only by the soldering without the insertion of the lead pins into the holes of the FPC board, the assembling may be simplified and the workability may be improved. For instance, for the case of the aforementioned OSA that provides four lead pins, even if the width of the soldering pad formed on the FPC board is 0.65 mm, the enough space can be ensured for the soldering the lead pins thereto.

(iii) For the arrayed lead pin, soldering pads on the FPC board may be arranged in a zigzag pattern for adjacent lead pins, which enhances the flexibility for designing the wiring pattern on the FPC board.

(iv) The gap between the OSA and the circuit board may be adjusted by the distance between the lead pin and corresponding pad on the FPC board, which releases the stress induced at the contact point between the FPC board and the circuit board.

(v) By inserting a support member in the gap of the U-shaped FPC board, not only the FPC board but also the lead pin may be mechanically reinforced.

Next, preferred embodiments of the present invention will be described as referring to accompanying drawings. In the specification and the drawings, the same symbols and numerals will refer to the same elements without overlapping explanations.

First Embodiment

Figure 1:
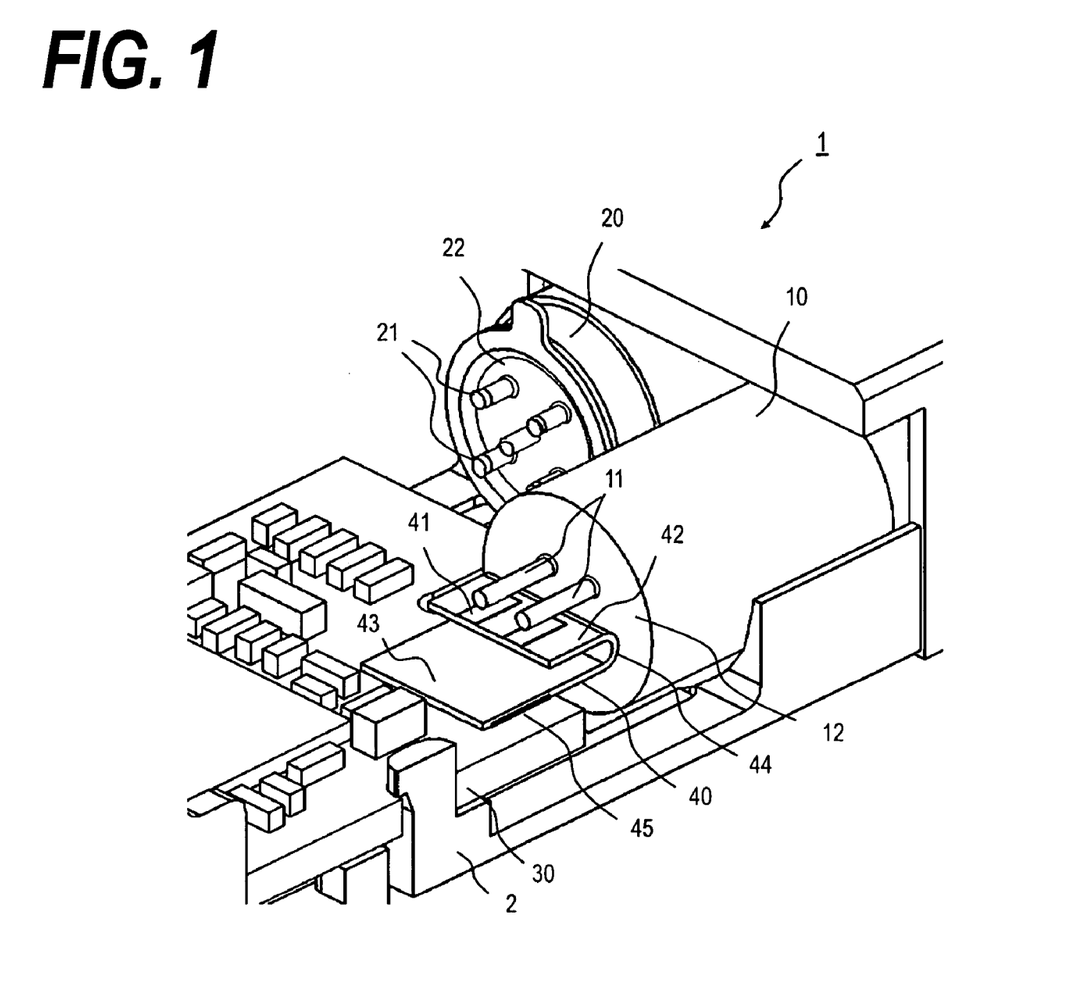
FIG. 1 is a perspective view showing the coupling mechanism between the optical subassembly and the circuit board according to the present invention.

FIG. 1 schematically illustrates an arrangement of the present invention. In FIG. 1, an FPC board for the receiving optical subassembly (hereinafter denoted as ROSA) 20 is omitted.

Lead pins 11 of a transmitting optical sub-assembly (hereinafter denoted as TOSA) 10 are arranged in up and down rows substantially in parallel to each other and in parallel to a primary surface of the circuit board. FIG. 1 omits the lower row. Between the upper and lower rows is inserted with an FPC board 40. That is, the FPC board includes first and second pieces arranged in up and down, and third piece connecting the first piece with the second piece. These first to third pieces forms the U-shape in the side cross section. The third piece 44 faces the stem 12 of the TOSA 10, the second piece of the FPC board 40 is extended to the circuit board 30 and connected thereto.

On the FPC board 40 is formed with wiring patterns and contact pads 41. When the FPC board 40 is a single-sided board, in which only one surface thereof provides the wiring pattern, the wiring patterns are connected to corresponding pads on the circuit board 30 as the FPC board 40 extends. On the other hand, when the FPC board 40 is a type of double-sided board, in which the wiring patterns are formed in both surfaces thereof, flexibility of the wiring design will enhance. That is, for example, the third piece of the FPC board 40 is likely to touch the stem 12 of the TOSA 10 when the FPC board 40 is bent in the U-shape for the single-sided board. However, for the double-sided board, wiring patterns to be connected to the lead pins 11 in the upper row are guided to the other side 43 of the FPC board 40, i.e. the inner side 43 of the U-shape, through via holes just after the connection to the lead pin. The wiring guided to the other surface 43 may be re-guided to the primary surface 42 of the FPC board 40 at the extended portion to the circuit board 30. Thus, according to the configuration of the present invention, the lead pins 11 of the optical subassemblies, 10 and 20, may be connected with the FPC board 40 without forming via holes into which the lead pins are to be inserted.

Figure 2:
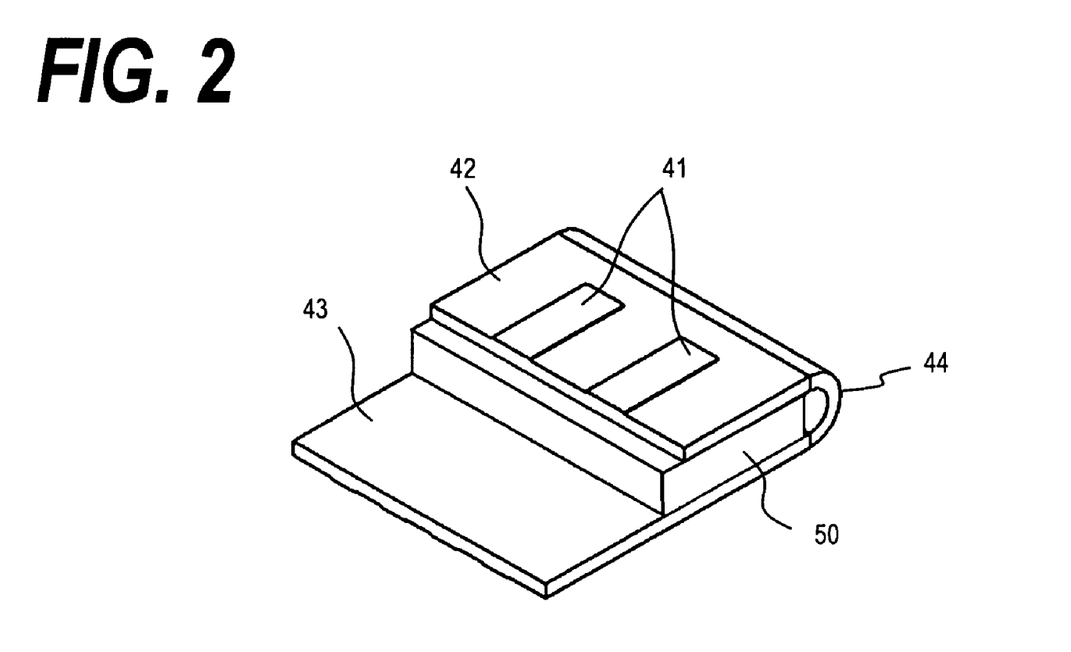
FIG. 2 is a perspective view showing the FPC board bent in the U-shape and put the support member within the U-shape.

In the embodiment shown in FIG. 1, although the FPC board 40 is bent in the U-shape, but no support member is inserted between the first and second pieces. In such arrangement, since the FPC board 40 can not be self-supported during the soldering between the FPC board 40 and the circuit board 30 or between the FPC board 40 and the lead pin 11, the arrangement without any support member is inconvenient to handle. FIG. 2 illustrates an example to overcome this subject, in which a support member 50 is inserted within the inside of the U-shape. The support member 50 may be made of resin and glass ceramics. The support member 50 may be attached to the FPC board 40 in advance to the soldering, or may be merely wrapped with the FPC board 40 and thus assembled FPC board 40 with the support member 50 may be connected to the lead pin 11.

Figure 3:
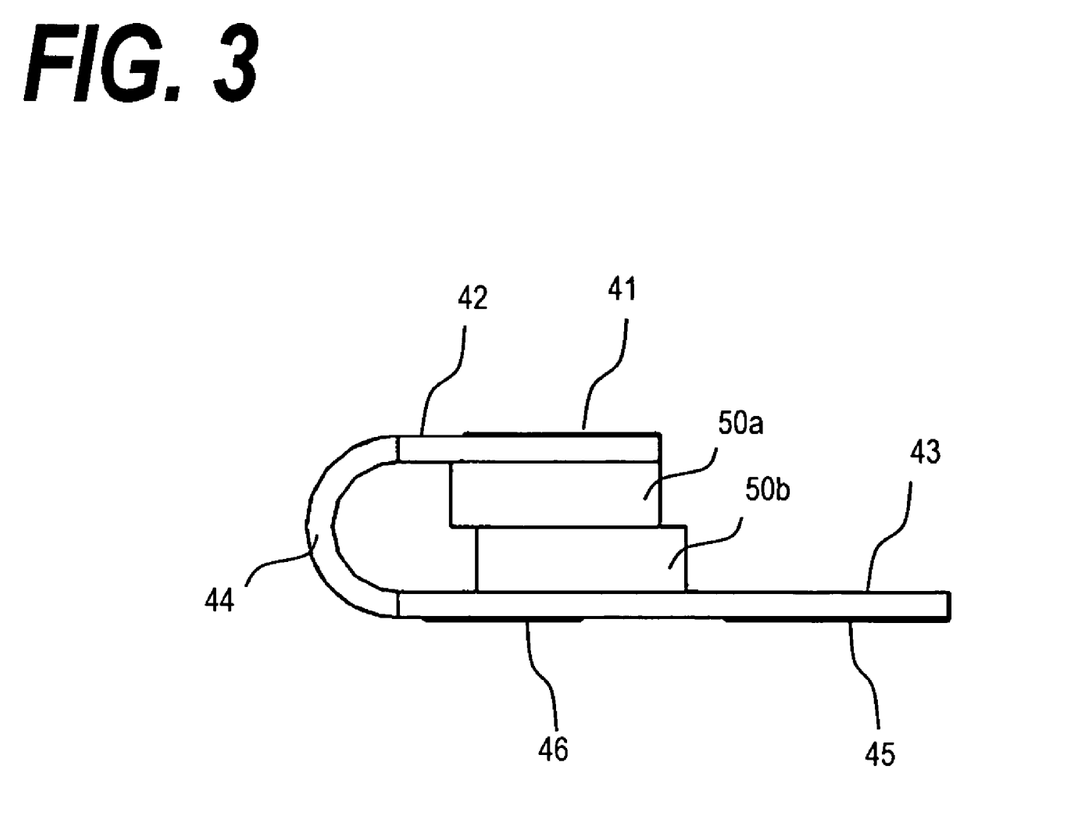
FIG. 3 is a side view of the FPC board put two support member stacked to each other between the FPC board.

FIG. 3 illustrates another modified arrangement of the invention. When the thickness of the support member 50 is thin compared to the gap between rows of the lead pins 11, the support member 50 can not reinforce the FPC board 50 and the lead pins 11. Except that the thickness of the support member 50 is adjustable, the material is restricted from the viewpoint of the physical characteristic. In such a case, by arranging a plurality of support members, 50a and 50b on the FPC board 40 and by stacking the these embers, 50a and 50b, by bending the FPC board 40, a mechanism to support the lead pins 11 arranged in rows with a wider space therebetween may be realized.

Second Embodiment

Figure 4A:
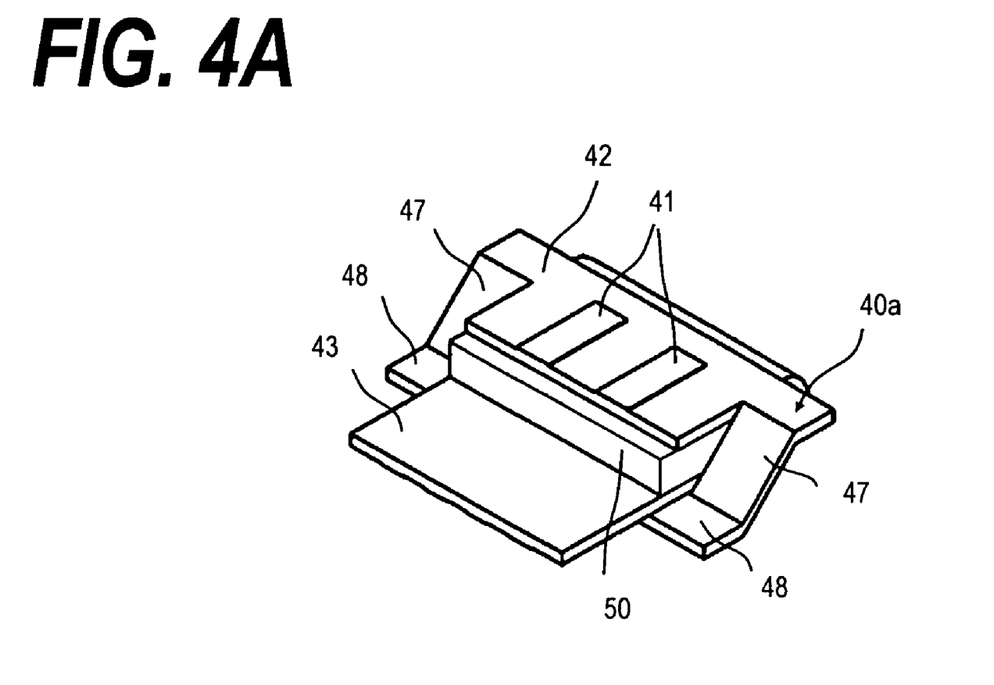
FIGS. 4A and 4B are perspective drawings, viewed from the top and the bottom, respectively, of the FPC board with the extending portion in both sides thereof.
Figure 4B:
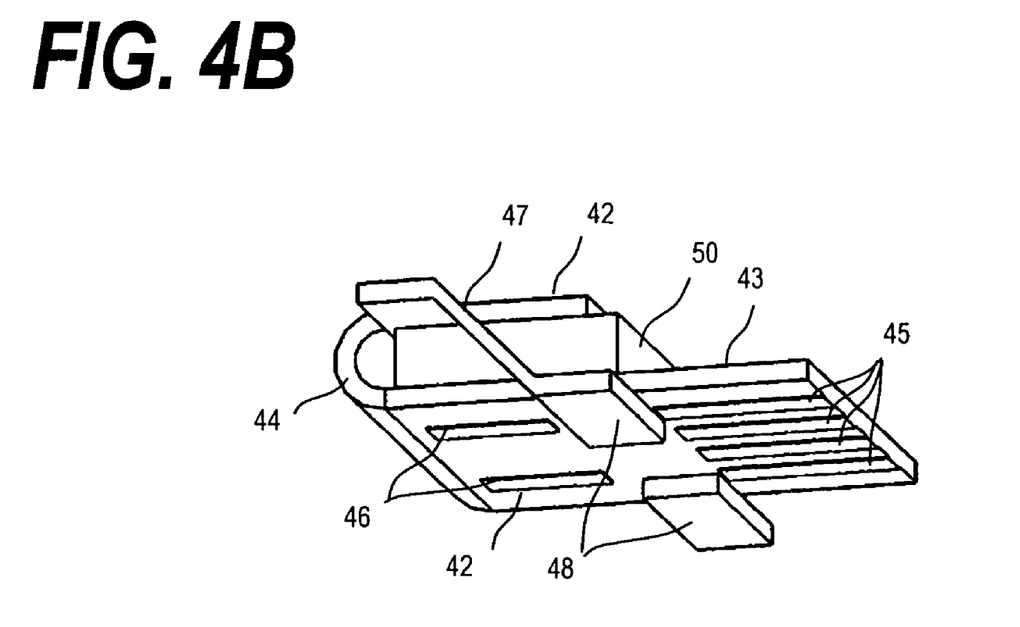

FIG. 4 shows still another modification of the first embodiment. In FIG. 4, similar to the former example, the FPC board 40a is folded to sandwich the support member 50. The first piece 42 of the FPC board 40a, which is connected to the lead pins in the upper row, has a wider width than that of the support member 50. Portions of the FPC board 40a protruding from both sides are bent in zigzag, 47 and 48, to form a tab portion 48 in the tip thereof. A level of the tab portion 48 is substantially equal to the level of the second piece of the FPC board 30. FIG. 4 illustrates the tab portion 48 whose level is below the second piece of the FPC board 40a. This shape prevents the tab portion 48 from making a gap against the circuit board 30. Thus, the arrangement shown in FIG. 4, the first piece of the FPC board may be also connected to the circuit board 30 without passing the bent portion 44. Accordingly, the reinforcement of the FPC board 40a may be enhanced accompanied with the insertion of the support member 50 within the U-shape.

Third Embodiment

In previous embodiments, the lead pins 11 of the OSAs, 10 and 20, arranged in a row or two rows are attached to the FPC board 40. In the second embodiment, another configuration is illustrated, in which the lead pins 11 arranged in triple or more rows are connected to the FPC board 40. In particular, the ROSA 20 generally installs the pre-amplifier, and by configuring the output of the pre-amplifier to be complementary to secure the high frequency performance thereof. Accordingly, the ROSA 20 generally provides five lead pins, namely, two for the signal output, one for the power supply to the preamplifier, one for the bias supply to the photodiode, and one for the ground. These lead pins are arranged such that the pin for the ground positions in the center of the stem 22 and other four pins surround this center ground pin, which makes three rows of the lead pins.

Figure 5A:
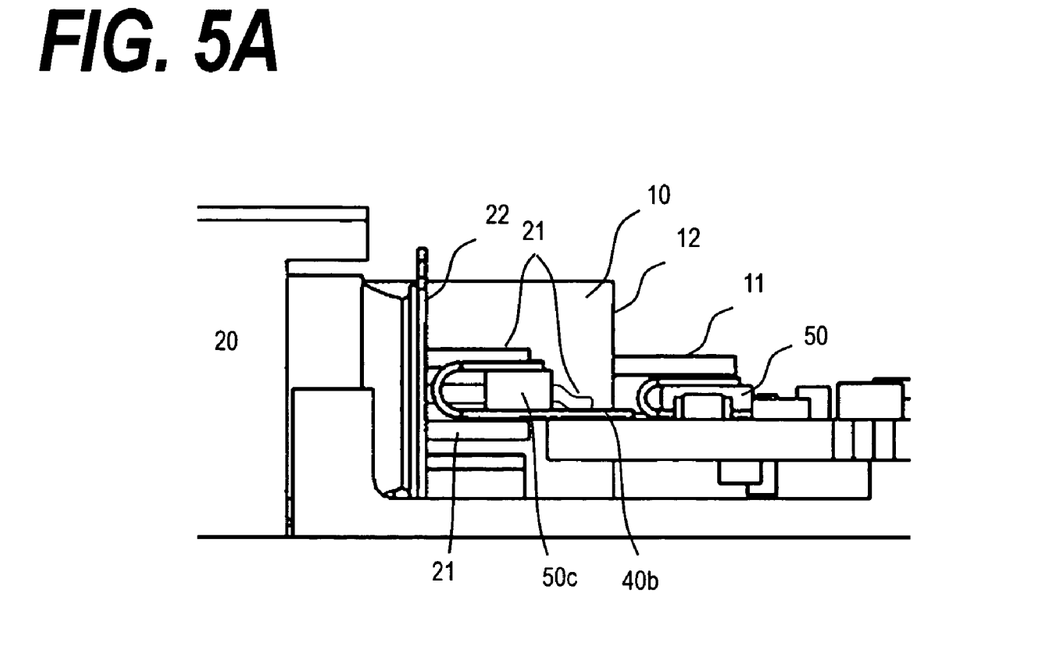
FIGS. 5A and 5B show, a side view and a perspective view, respectively, of a coupling mechanism of the third embodiment of the present invention.
Figure 5B:
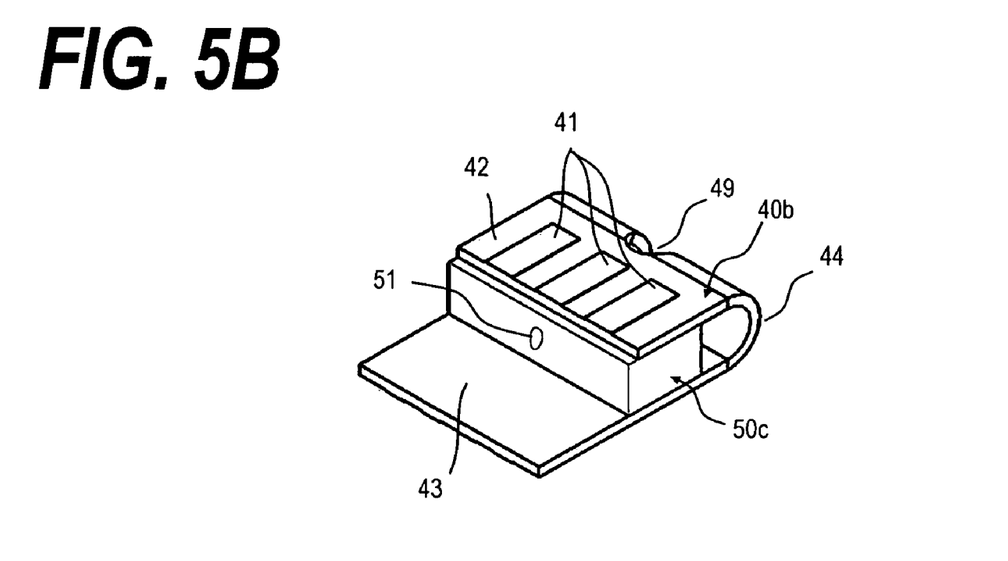

As shown in FIG. 5, the FPC board 40b forms an opening 49 at a center in the third piece 43. For the case of the single-sided FPC board, the lead pins in the middle row are bent in the U-shape and inserted into this opening 49 to come in contact with the pad formed in the first piece of the FPC board 40b. While, in the case of the double-sided FPC board, the lead pin in the middle row may be connected to the FPC board 40b without bending in the U-shape, but with inserting into the opening 49. The support member 50c, sandwiched by the FPC board 40b, may form a groove or an opening 51 to pass the center lead pin therethrough in a portion corresponding to the opening 49 in the FPC board 40b. The pad to be connected to the lead pin in the middle row is formed in the second piece 43 of the FPC board 40b. Setting the lead pin into the opening 51, connecting the lead pin with the pad on the FPC board 40b, where the pad is guided to the opposite surface 43 thereof, the lead pins in the middle row may be connected to the circuit board.

Fourth Embodiment

Figure 6:
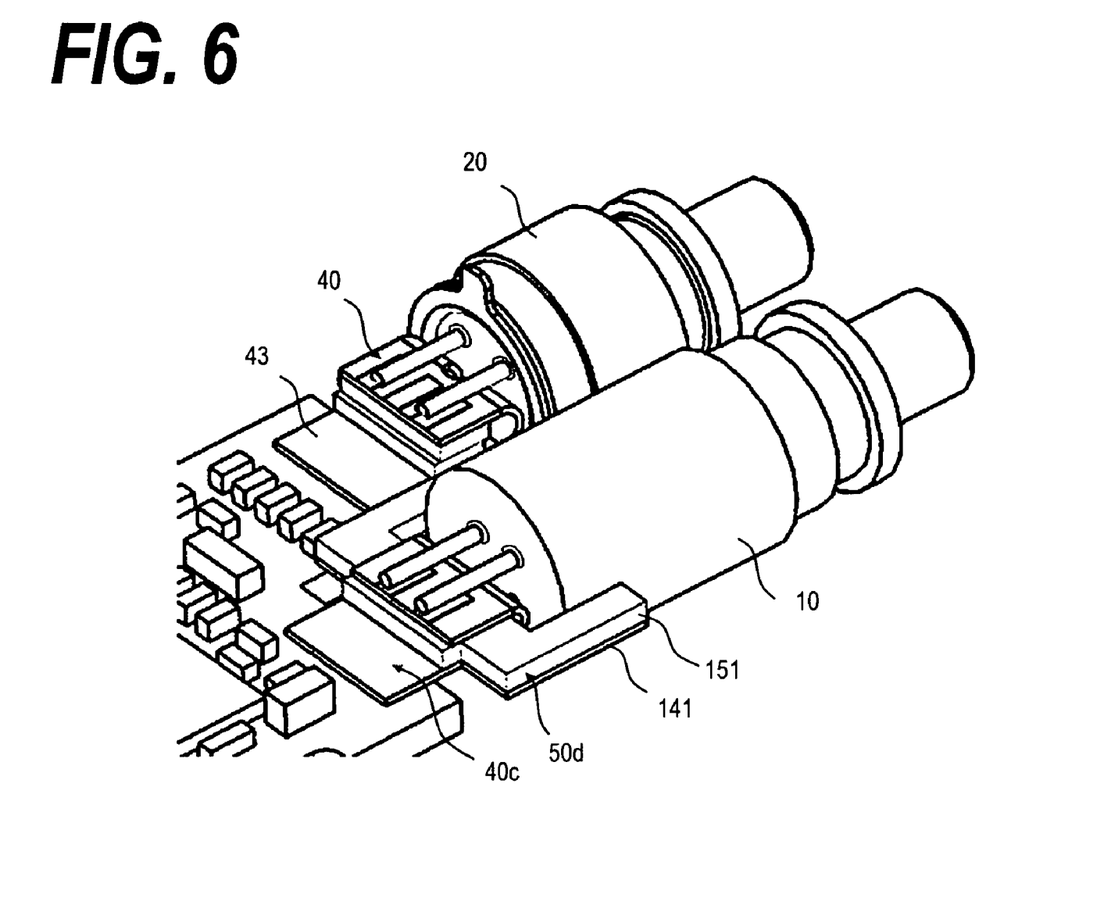
FIG. 6 shows a coupling mechanism with the guide portion according to the fourth embodiment of the invention.

FIG. 6 illustrates the fourth embodiment. In this embodiment, the support member 50d, sandwiched by the FPC board 40c, extends both sides thereof as a guide member, 141 and 151, to sandwich and to support the TOSA 10. Guide portions 151 of the support member 50d are not fixed to the TOSA 10. However, the position of the TOSA 10 may be automatically horizontally set to the FPC board 40c by the guide portion 151. This arrangement of the support member 50d and the TOSA 10 are preferable to arrange lead pins 11 of the TOSA 10 against the FPC board 40c. The up and down position of the TOSA 10 may be determined by the arrangement that the lead pins 11 sandwich the FPC board 40c therebetween. Accordingly, this guide mechanism 151 of the support member may set the position of the TOSA 10 in six directions in back and forth, in up and down, and in left and write. FIG. 6 illustrates that the FPC board 40c also provides the guide portion 141. However, when the guide portion, 141 and 151, merely sandwiches the TOSA 11, this extended portion 141 of the FPC board 40c is unnecessary. When the guide portion 141 is necessary to come in contact to the side of the TOSA 10 in electrical and thermal, as will be illustrated later, the guide portion 141 of the FPC board 40c is necessary.

Figure 7:
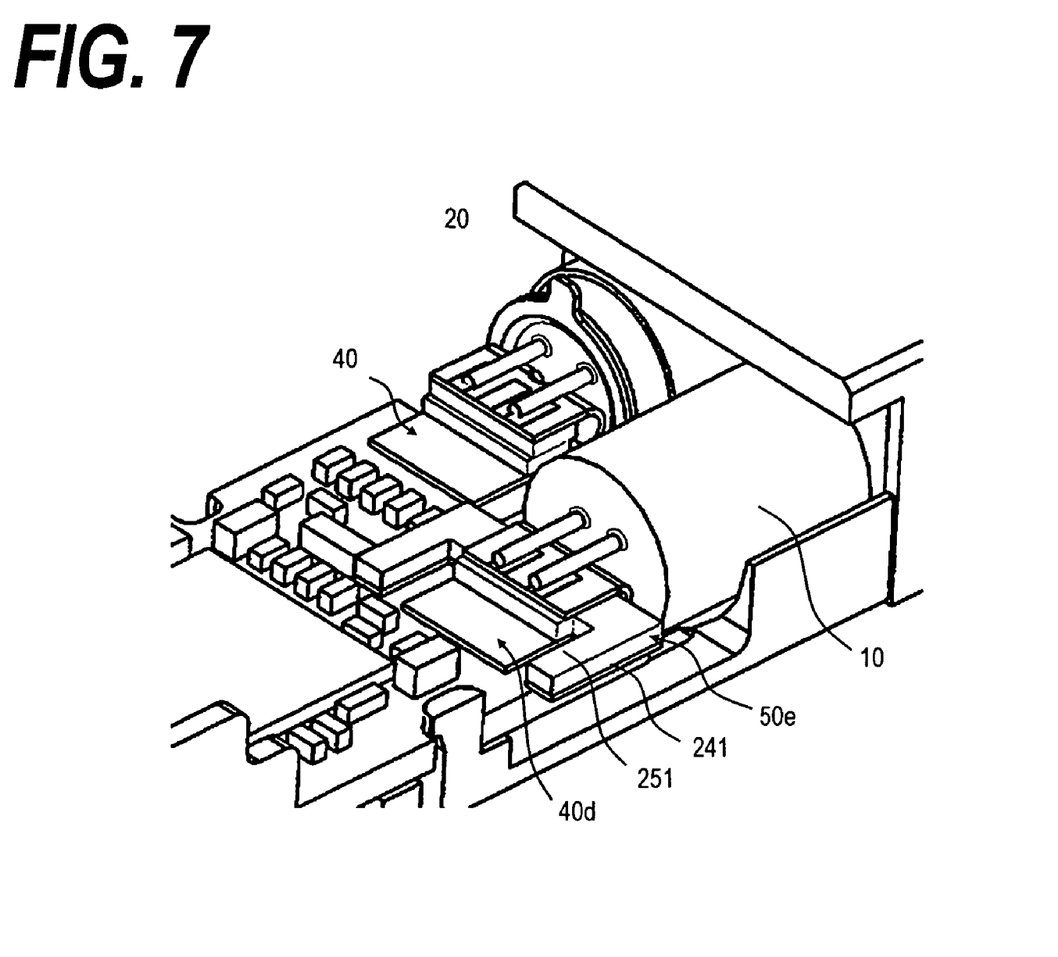
FIG. 7 shows one modification of the fourth embodiment shown in FIG. 6, which provides another guide portion.

FIG. 7 shows a modification of the fourth embodiment shown in FIG. 6. In this modification, the support member 50e is extended in the sides thereof, similar to those shown in FIG. 6, but the extended portion 251 of the present embodiment heads, not for the TOSA 10, but for the circuit board 30. According to this arrangement, stress induced in the FPC board 40d may be transferred to the circuit board 30, thereby enhancing the reliability of the connection between the TOSA 10 and the circuit board 30. The guide portions, 241 and 251, may be mechanically attached to the circuit board 30 through an insulator, as shown in FIG. 7, but the electrical connection may be applicable. For example, forming an opening in the guide portions, 241 and 251, and to set a screw into this hole to the circuit board may fix the guide portions, 241 and 251, with the circuit board 30. In another example, forming a metal pad in the underside of the guide portion 241, to solder this pad with a pad formed on the circuit board 30 may fix the guide portions, 241 and 251, with the circuit board in electrical and mechanical.

Figure 8A:
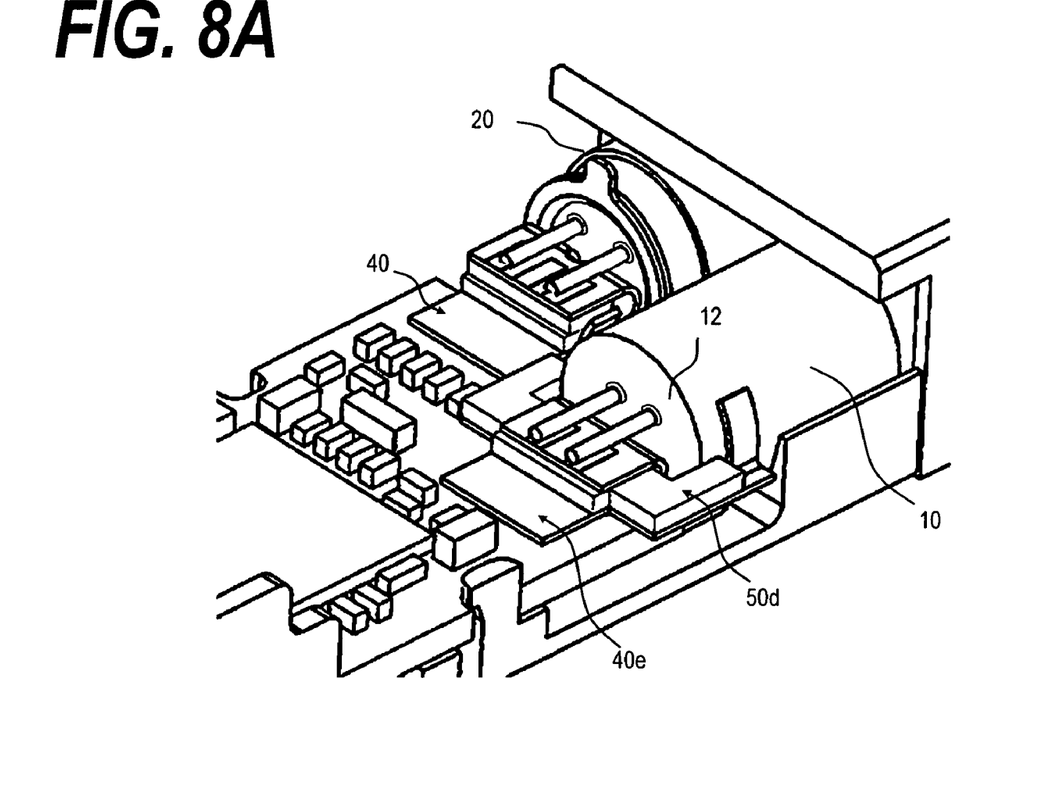
FIGS. 8A and 8B show another modification of the fourth embodiment shown in FIG. 6, which provides a guide portion of the FPC board in electrically and thermally contact to the side of the OSA.
Figure 8B:
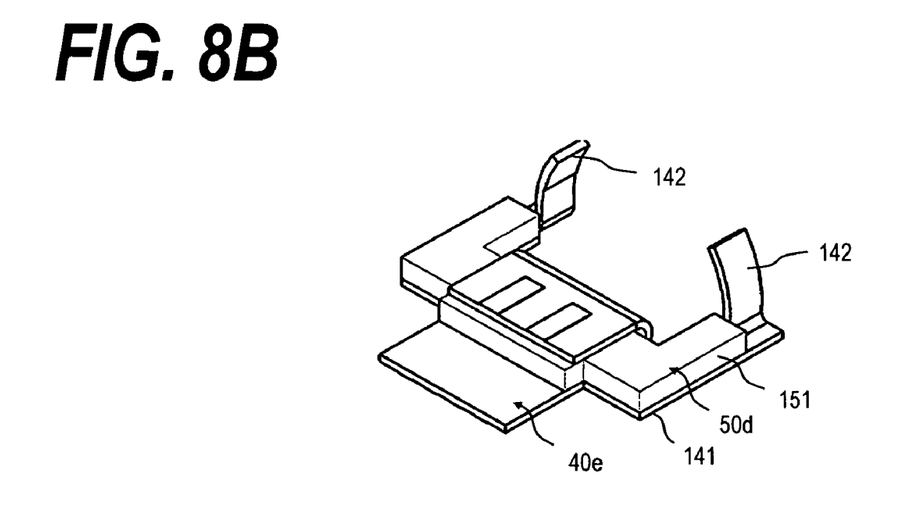

This embodiment has further modifications as shown in FIGS. 8A and 8B. In FIG. 8, not only the support member 50d reinforces the TOSA 10 at the extended portion 151 thereof but also the FPC board 40e electrically comes in contact with the side surface of the TOSA 10. That is, on the surface of the extended portion 142 of the FPC board 40e is formed with pads so as to come in contact with the outer surface of the TOSA 10, which is generally made of metal. Accordingly, to be the FPC board 40e in contact to the side of the TOSA 10 may improve the EMI shielding effect of the TOSA 10.

The arrangement shown in FIGS. 8A and 8B may also enhance the heat dissipating efficiency in addition to increase the EMI shielding effect. The conventional TOSA, in particular, the TOSA having a co-axial package generally installs the photodiode in addition to the laser diode to monitor the optical output power from the laser diode. However, recent optical communication system, especially in the wavelength division multiplex (WDM) communication system, requires the precise control of the signal wavelength. In such a system, the TOSA is necessary to install the thermoelectric controller (TEC) to control the temperature of the laser diode to stabilize the output wavelength even if the package thereof is co-axial.

In the TEC, one of plates where the laser diode is placed thereon is cooled down, while, the other plate is heated up to compensate the cooling down of the plate. The other plate that is heated up is attached to the stem 12 of the package, so the temperature of the outer surface of the package increases. In the arrangement shown in FIGS. 8A and 8B, the pad provided in the extended portion 142 of the FPC board 40e directly comes in contact to the outer surface of the TOSA 10, while, the other end of this pad is connected to the wiring pattern on the circuit board 30, which releases the heat generated within the TOSA 10 to the circuit board 30 through the wiring pattern on the FPC board 40e. Thus, the heat dissipating effect of the TOSA 10 can be enhanced through the FPC board 40e. The support member 50d made of resin with good thermal conductivity or some metal such as copper will further enhance this heat dissipating effect.

Fifth Embodiment

As described in FIG. 8, when the TOSA 10 installs the TEC device, additional lead pins are necessary to supply the driving current for the TEC. On the other hand, the request for miniaturizing the optical transceiver is firmly and continuously arisen, which inevitably shrinks the diameter of the TOSA 10. One effective method for providing a number of lead pins in such shrunk package is to use an arrayed lead pin.

Figure 9A:
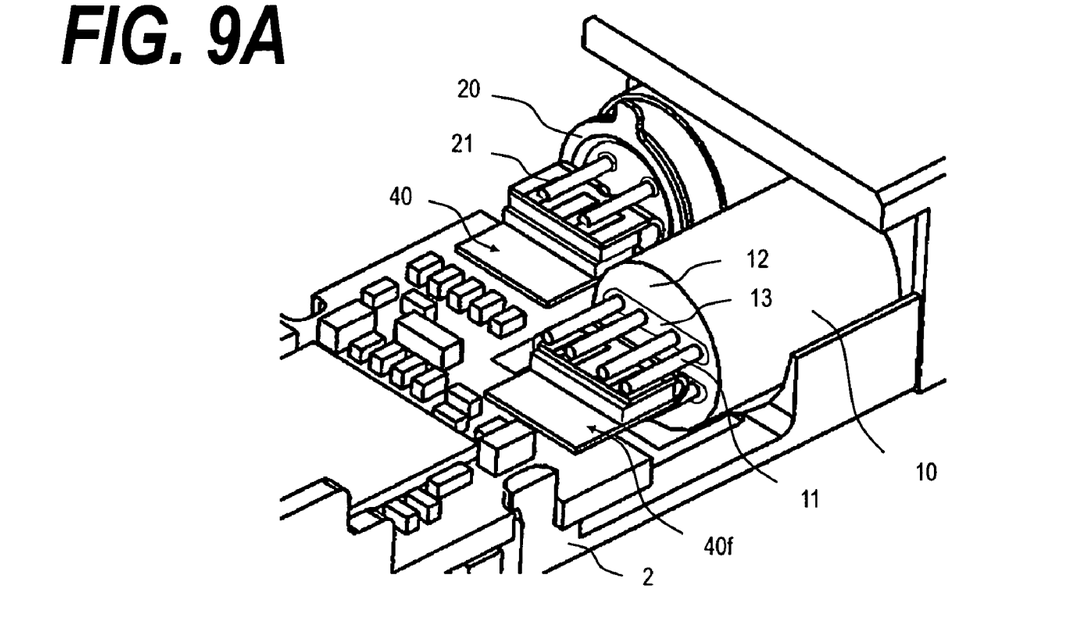
FIGS. 9A to 9C show the fifth embodiment of the coupling mechanism according to the present invention, in which the OSA provides the arrayed lead pin in contact to the FPC board bent in the U-shape and inserted between the arrayed lead pins.

In the conventional co-axial package, via holes are provided in the stem for each lead pin. That is, each lead pin hermetically seals the inside of the co-axial package by passing through the corresponding via hole in the stem and by filling the gap between the lead pin and the via hole with the seal glass. This conventional arrangement may be recognized in the ROSA 20 shown in FIG. 9A. However, as explained, inconsistent requests of increasing the number of lead pin and of miniaturizing the package are continuously presented. Accordingly, it becomes quite hard to allocate a via hole for each lead pin. One solution is to use an arrayed lead pin. In FIG. 9A, four lead pins 11 in the upper row and another four lead pins in the lower row, which are not illustrated in FIG. 9, collectively passes through one via hole 13 with an elongated circle as isolating respective lead pins by filling the seal glass to ensure the isolation between lead pins. The conventional method requires about 0.125 mm (½ mil) to seal the independent lead pin, while, for the arrayed lead pin, the space between pins can be narrowed to, for example, about ¼ mil.

However, when lead pins having such narrowed space are connected to the circuit board 30, it is often encountered that the narrowed space of lead pins at the TOSA 10 can not be reflected in the circuit board 30. Accordingly, the lead pins 11 are necessary to be connected to the circuit board 30 after expanding the space therebetween. This work, for example, expanding the space of lead pins 11 by the tweezers before soldering them, is not only less workability but also may affect the mechanical stress to the lead pin 11.

Figure 9B:
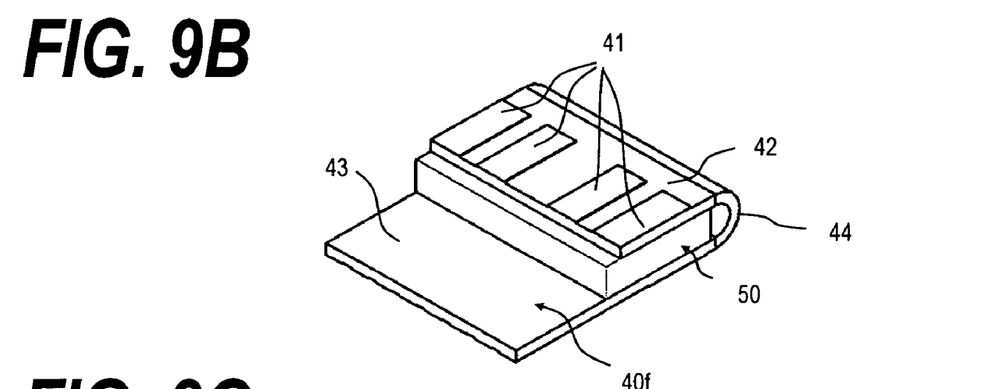
Figure 9C:
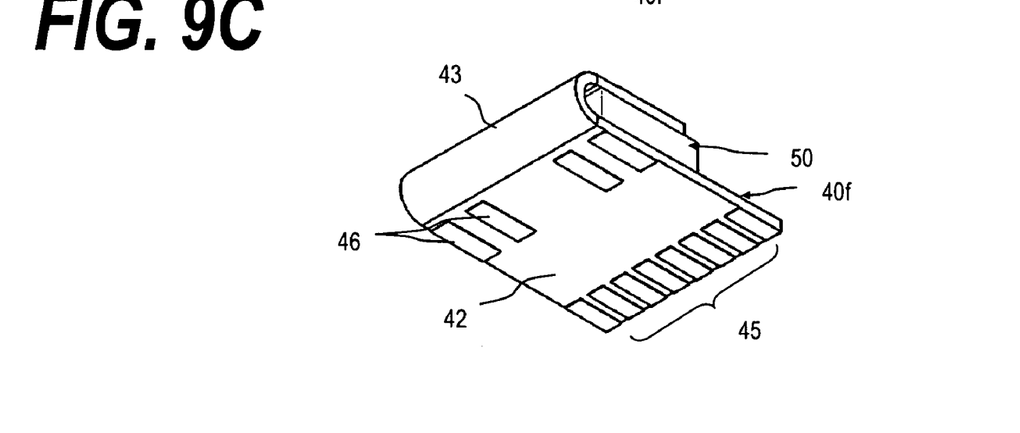

In the present method shown in FIGS. 9A to 9C, the lead pins 11 having such narrowed space, are collectively soldered to the FPC board 40f, and the FPC board 40f and the circuit board 30 are also soldered to each other. This method may not only improve the workability of the soldering but also release the lead pin 11 from being affected by the mechanical stress because the lead pins 11 are not necessary to expand their space. Moreover, by inserting the support member 50 between the first and second pieces of the FPC board 40f, the space between the first and second pieces thereof may coincide with the distance between the upper and lower rows of the arrayed lead pin 11. Therefore, it enables to solder this arrayed lead pin at the same time.

In the conventional method to solder such arrayed lead pin arranged in two rows, the TOSA 10 is set in a prescribed position within the transceiver 1 first. Next, the upper row of the lead pin is soldered from the upper side of the transceiver 1. Finally, the lower row of the lead pin is soldered from the lower side of the transceiver 1. Accordingly, the frame, on which the TOSA 10 and the circuit board 30 are installed, is necessary to provide an opening for soldering the lower row of the lead pin. However, in the present method using the FPC board 40f soldered to the arrayed lead pin, the FPC board 40f is first soldered to the TOSA 10, installs the TOSA 10 with the FPC board 40f in the transceiver 1, and finally, solders the FPC board 40f to the circuit board 30. Therefore, it is unnecessary to provide any opening in the frame 2 of the transceiver 1 to solder the lower row of the lead pin, and the soldering itself may be simplified.

In the FPC board 40f shown in FIG. 9A, the upper row of the lead pins 11 is connected to the pads 41 provided in the first piece 42 of the FPC board 40f, and the wiring, extending from these pads 41, passing the bent portion 44 of the FPC board 40f and between pads 46 provided in the second piece 43, which is to be connected to the lower row of lead pins, is finally reached to the pads 45 and connected to the circuit board 30. The pads 46 for the arrayed lead pin, which are provided on the second piece 43 of the FPC board 40f, are designed to be narrow in the space thereof to connect to the lower row of the lead pin without expanding the space therebetween. Therefore, it is occasionally impossible to pass the wiring for the upper row of the lead pins 11 between the pads 46 for the lower row of the lead pins.

Figure 10:
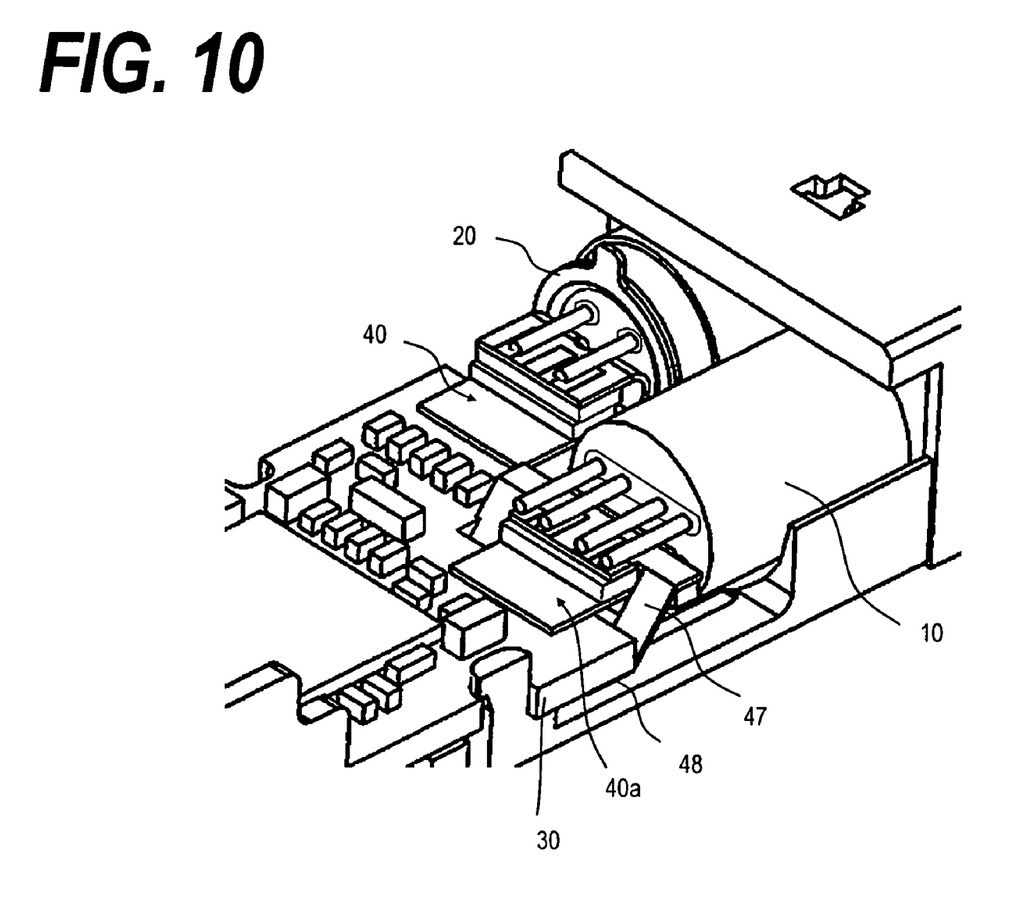
FIG. 10 shows a modification of the fifth embodiment shown in FIGS. 9A to 9C, in which the guide portion is connected to the circuit board similar to the embodiment shown in FIG. 4.

For such situation, an arrangement shown in FIG. 10 may be applicable, in which the wiring provided on the first and second pieces, 42 and 43, of the FPC board 40f are divided and independently connected to the circuit board 30 through different paths. This arrangement applies the configuration of the FPC board 40a and the support member shown in FIG. 4. That is, the lead pins 11 in the upper row are connected to the pads 41 provided in the first piece 42 of the FPC board 40a. The wiring extending from these upper pads 41 pass two tabs, 47 and 48, extruding from both sides of the first piece 42 of the FPC board 40a and reach the pads formed in the edge portion 48 of the tabs. Finally, these pads in the edge portion 48 are soldered to the pads formed in the circuit board 30. Thus, the wirings from the upper pads 41 of the FPC board 40a are unnecessary to pass between the lower pads 46.

In FIG. 10, the end of the tab 48 forms pads in the upper surface thereof, and these pads are connected to the underside of the circuit board 30. However another arrangement may be considered that the tab 48 provides the pads in the back surface thereof to connect the corresponding pads on the top surface of the circuit board 30 and the pads in the back surface of the tab 48 transferred to the top surface of the tab 48 by the via holes.

Figure 11:
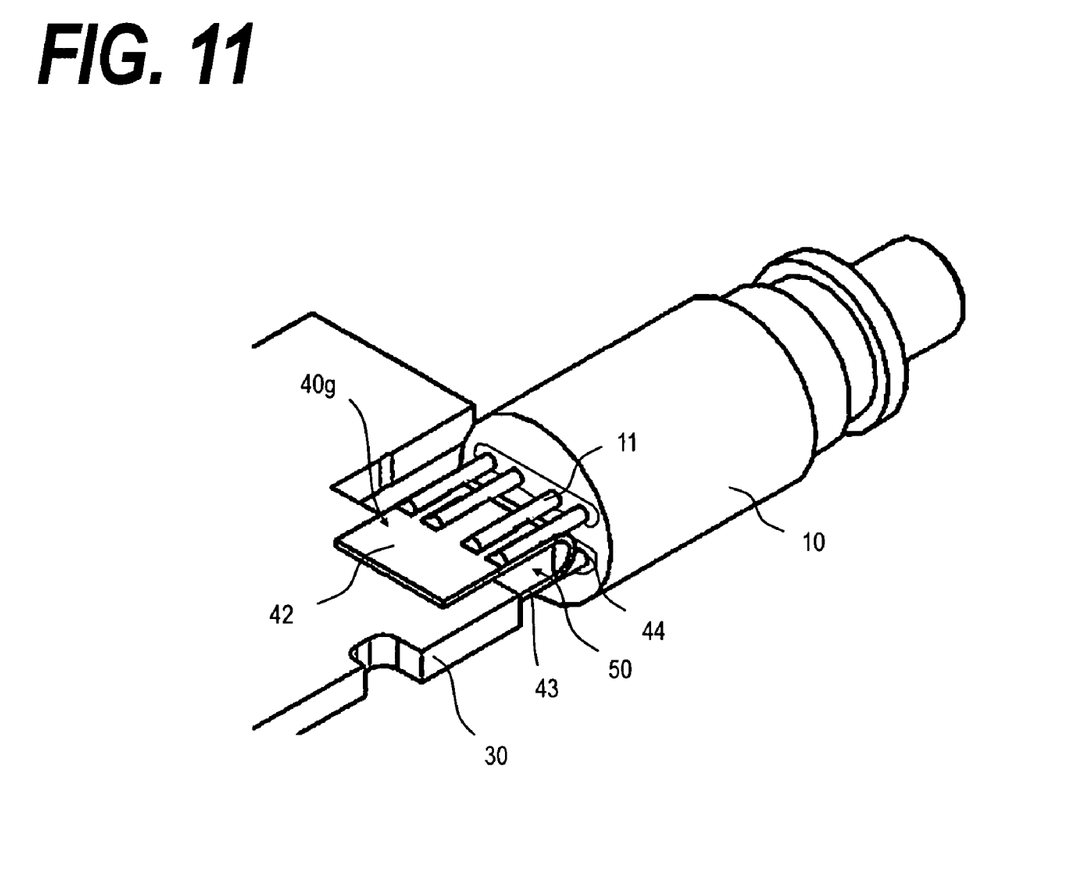
FIG. 11 shows another modification of the fifth embodiment, in which the FPC board bent in the U-shape puts the circuit board therebetween.

FIG. 11 illustrates further modified arrangement. In this embodiment, the FPC board 40g, bent in the U-shape as ordinary in the previous embodiments, is inserted between the arrayed lead pins 11 arranged in two rows. The pads 41 to be connected to the lead pins are formed in the top surface 42 of the FPC board 40g, while other pads to be connected to the circuit board 30 are provided in the rear surface 43 of the FPC board 40f. Further, the circuit board 30 and the support member 50 are inserted between the inside of the FPC board. The lead pins 11 in the upper row are connected to the pad 41 formed in the top surface 42 of the FPC board 40g, and these pads 41 are transferred to the pads in the top surface of the circuit board 30. On the other hand, the lead pins in the lower row are similarly transferred to the pads in the rear surface of the circuit board 30. Thus, the wiring for the lead pins in the upper row does not intersect the wiring for the lead pins in the lower row on the FPC board.

This arrangement between the FPC board 40g and the circuit board 30 not only improves the productivity but also the reliability as compared to the conventional arrangement that the lead pins configured in two rows directly sandwich the circuit board 30. The conventional arrangement concentrates the mechanical stress in the root portions of the arrayed lead pin, while, the arrangement shown in FIG. 11, by providing the FPC board 40g therebetween, may transfer the mechanical stress to the connecting portion between the FPC board 40g and the circuit board 30.

Thus, the method for connecting the OSA to the circuit board according to the present invention, not only simplifies the process for manufacturing the optical transceiver installing the OSA with a number of lead pins but also enhances the reliability by relaxing the stress induced in the lead pins. Further, by matching the impedance of the pads and the wirings provided on the FPC board to the characteristic impedance, it is possible to compensate the degradation of the high frequency signal. Moreover, The FPC board in the present invention can mount bypass capacitors and some integrated circuits just immediate to the OSA. In the conventional FPC board, the stiffness of the material used in the FPC board and the area may be one of subjects to install capacitors and ICs thereon. On the other hand in the present invention, the support member may solve the subject for the stiffness of the FPC board. Further, in embodiments thus illustrated, though the pads on the FPC board and on the circuit board connect therebetween by soldering, the electrical connector attached to the FPC board may also connect to the circuit board.

What is claimed is:

1. A coupling mechanism with a flexible printed circuit board between an optical subassembly and a circuit board each installed within an optical transceiver, the flexible printed circuit board providing a wiring pattern on a primary surface thereof,
wherein the optical subassembly has a plurality of lead pins arranged in at least two rows, and
wherein the flexible printed circuit board is folded between the rows of the lead pins so as to form a U-shape in a side cross section thereof to connect the wiring pattern on the primary surface of the flexible printed circuit board with the lead pins without forming via holes for the lead pins.

2. The coupling mechanism according to claim 1,
wherein the flexible printed circuit board includes an upper piece, a lower piece, and a connecting piece to form the folded flexible printed circuit board, and
the coupling mechanism further comprising a support member put between the lower and upper pieces of the flexible printed circuit board.

3. The coupling mechanism according to claim 2,
wherein both side portions of the support member extends so as to put the optical subassembly therebetween.

4. The coupling mechanism according to claim 2,
wherein both side portions of the lower piece extends so as to put the optical subassembly therebetween and come in contact to sides of the optical subassembly.

5. The coupling mechanism according to claim 2,
wherein side portions of the support member extends to the circuit board to be fixed to the circuit board.

6. The coupling mechanism according to claim 1,
wherein the plurality of lead pins includes two arrayed lead pin each arranged in parallel to the primary surface of the circuit board.

7. An optical transceiver, comprising:
a circuit board with a primary surface having an electronic circuit installed thereon;
an optical subassembly having a plurality of lead pins arranged in at least two rows, the optical subassembly installing at least one of a laser diode and a photodiode electrically coupled with the electronic circuit; and
a flexible printed circuit board folded in a U-shape including a first piece, a second piece and a third piece connecting the first piece with the second piece, the first piece and the second piece being connected with the lead pins arranged in one of the rows and in the other of the rows, respectively, without forming via holes in the first and second pieces of the flexible printed circuit board.

8. The optical transceiver according to claim 7,
further comprising a support member provided between the first and second pieces of the flexible printed circuit board.

9. The optical transceiver according to claim 8,
wherein a portion of the plurality of lead pins is arranged in a third row intermediate between the two rows, and
wherein the support member and third piece of the flexible printed circuit board each provide an opening into which the portion of the lead pins arrange in the third row.

10. The optical transceiver according to claim 8,
wherein both sides of the support member are extended so as to sandwich the optical subassembly therebetween.

11. The optical transceiver according to claim 8,
wherein the second piece of the flexible printed circuit board is extend so as to come in contact to the optical subassembly.

12. The optical transceiver according to claim 8,
wherein the support member is extend to the circuit board so as to be fixed thereto.

13. The optical transceiver according to claim 7,
wherein the first and second pieces extend substantially in parallel to the primary surface of the circuit board, and
wherein one of the first and second pieces is connected with the primary surface of the circuit board and the other of the first and second pieces is connected with the other of the primary surface.

14. The optical transceiver according to claim 7,
wherein the first and second pieces extend substantially in parallel to the primary surface of the circuit board,
wherein the second piece is connected to the primary surface of the circuit board, and
wherein the first piece provides a tab in a side thereof, the tab being bent in zigzag and connected with the primary surface of the circuit board.

15. The optical transceiver according to claim 7,
wherein the first and second pieces extend substantially in parallel to the primary surface of the circuit board,
wherein the second piece is connected to the primary surface of the circuit board, and
wherein the first piece provides a tab in a side thereof, the tab being bent in zigzag and connected with the other surface of the circuit board.

* * * * *